(12) United States Patent
Shen et al.

(10) Patent No.: US 9,859,527 B2
(45) Date of Patent: Jan. 2, 2018

(54) REFLECTIVE LAYER FOR INCREASING FILL FACTOR IN AN ELECTRONIC DISPLAY

(71) Applicant: Oculus VR, LLC, Menlo Park, CA (US)

(72) Inventors: Shizhe Shen, San Mateo, CA (US); Evan M. Richards, Santa Clara, CA (US)

(73) Assignee: Oculus VR, LLC, Menlo Park, CA (US)

( * ) Notice: Subject to any disclaimer, the term of this patent is extended or adjusted under 35 U.S.C. 154(b) by 0 days.

(21) Appl. No.: 15/062,844

(22) Filed: Mar. 7, 2016

(65) Prior Publication Data

US 2016/0268551 A1    Sep. 15, 2016

Related U.S. Application Data

(60) Provisional application No. 62/130,954, filed on Mar. 10, 2015.

(51) Int. Cl.

| H01L 29/08 | (2006.01) |
|---|---|
| H01L 51/52 | (2006.01) |
| H01L 27/32 | (2006.01) |
| H01L 27/12 | (2006.01) |
| H01L 51/00 | (2006.01) |

(52) U.S. Cl.
CPC ...... H01L 51/5271 (2013.01); H01L 27/1218 (2013.01); H01L 27/3244 (2013.01); H01L 51/5259 (2013.01); H01L 27/1222 (2013.01); H01L 27/1266 (2013.01); H01L 51/003 (2013.01); H01L 2251/5338 (2013.01)

(58) Field of Classification Search
CPC ............. H01L 51/5271; H01L 27/3244; H01L 51/5259; H01L 51/0097; H01L 51/003; H01L 51/56; H01L 27/1218; H01L 27/1222; H01L 27/1266; H01L 27/1274; H01L 2251/5338; H01L 2251/558
USPC .... 257/40, 59, 72, 88, 98, E51.001; 438/22, 438/25, 26, 27, 29
See application file for complete search history.

(56) References Cited

U.S. PATENT DOCUMENTS

| 2003/0111663 A1* | 6/2003 | Yagi ........................ H01L 27/12 257/59 |
| 2004/0079945 A1* | 4/2004 | Weaver ............... H01L 27/3248 257/71 |
| 2014/0048806 A1* | 2/2014 | Price ................. H01L 29/78618 257/57 |

(Continued)

*Primary Examiner* — Thinh T Nguyen
(74) *Attorney, Agent, or Firm* — Fenwick & West LLP (57) ABSTRACT

An electronic display includes a substrate and a thin-film transistor (TFT) layer deposited on a top surface of the substrate. The TFT layer includes a plurality of driving TFTs that are configured to provide current to one or more organic light emitting diodes (OLEDs). The electronic display also includes an emission layer deposited on a top surface of the TFT layer. The emission layer includes emission areas and non-emission areas that separate the emission areas. The emission areas include a plurality of OLEDs and each of the OLEDs are configured to be driven by one or more of the TFTs to emit light. The electronic display also includes a reflective layer formed on a bottom surface of the substrate. The reflective layer is configured to reflect at least some of the light emitted from the OLEDs toward the non-emission areas.

20 Claims, 6 Drawing Sheets

(56) References Cited

U.S. PATENT DOCUMENTS

| | | | |
|---|---|---|---|
| 2015/0227003 A1* | 8/2015 | Ninan | G09G 3/3426 359/237 |
| 2016/0070096 A1* | 3/2016 | Sasagawa | G09G 5/003 345/85 |
| 2016/0197293 A1* | 7/2016 | Chen | H01L 21/02354 257/40 |

* cited by examiner

REFLECTIVE LAYER FOR INCREASING FILL FACTOR IN AN ELECTRONIC DISPLAY

CROSS-REFERENCE TO RELATED APPLICATIONS

This application claims the benefit of prior U.S. Provisional Patent Application No. 62/130,954, filed Mar. 10, 2015, the disclosure of which is hereby incorporated by reference in its entirety.

BACKGROUND

The present disclosure generally relates to increasing fill factor of a display device, and specifically relates to increasing fill factor using a reflective layer in an organic light emitting diode (OLED) display.

Electronic displays such as OLED displays include a plurality of pixels, which may each include a plurality of sub-pixels (e.g., a red sub-pixel, a green sub-pixel, etc.). Arrangement of individual sub-pixels may affect the appearance and performance of an electronic display device. A sub-pixel includes both an emission area and a non-emission area, and the fill factor of the sub-pixel describes the ratio of light emission area versus total area of the sub-pixel. The non-emission areas thus limit the fill factor of each sub-pixel. Additionally, some arrangements of sub-pixels may increase fixed pattern noise under certain conditions. For example, magnification of a pixel may result in non-emission areas between individual sub-pixels of the pixel becoming visible to the user, resulting in a "screen door" pattern (i.e., an increase in fixed pattern noise) in an image presented to a user.

SUMMARY

An electronic display includes a reflective layer that reflects light emitted from each sub-pixel toward non-emission areas that are adjacent to the emitting emission devices (e.g., organic light emitting diodes), thereby increasing a fill factor for the display device. The electronic display includes a substrate, and a TFT (thin-film transistor) layer formed on a top surface of the substrate. The TFT layer includes a plurality of driving TFTs that are configured to provide current to one or more light emission devices. The electronic display also includes an emission layer formed on a top surface of the TFT layer and including emission areas and non-emission areas separating the emission areas, the emission areas including a plurality of emission devices each of which is configured to be driven by one or more of the TFTs to emit light. The electronic display also includes a reflective layer formed on a bottom surface of the substrate and configured to reflect at least some of the light emitted from the emission devices toward the non-emission areas. The reflective layer may be, for example, a metal film, a plurality of micro-reflectors (e.g., concave or diverging), or some combination thereof.

In some embodiments, the electronic display is incorporated into a virtual reality (VR) headset of a VR system.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

System Overview

Figure 1:
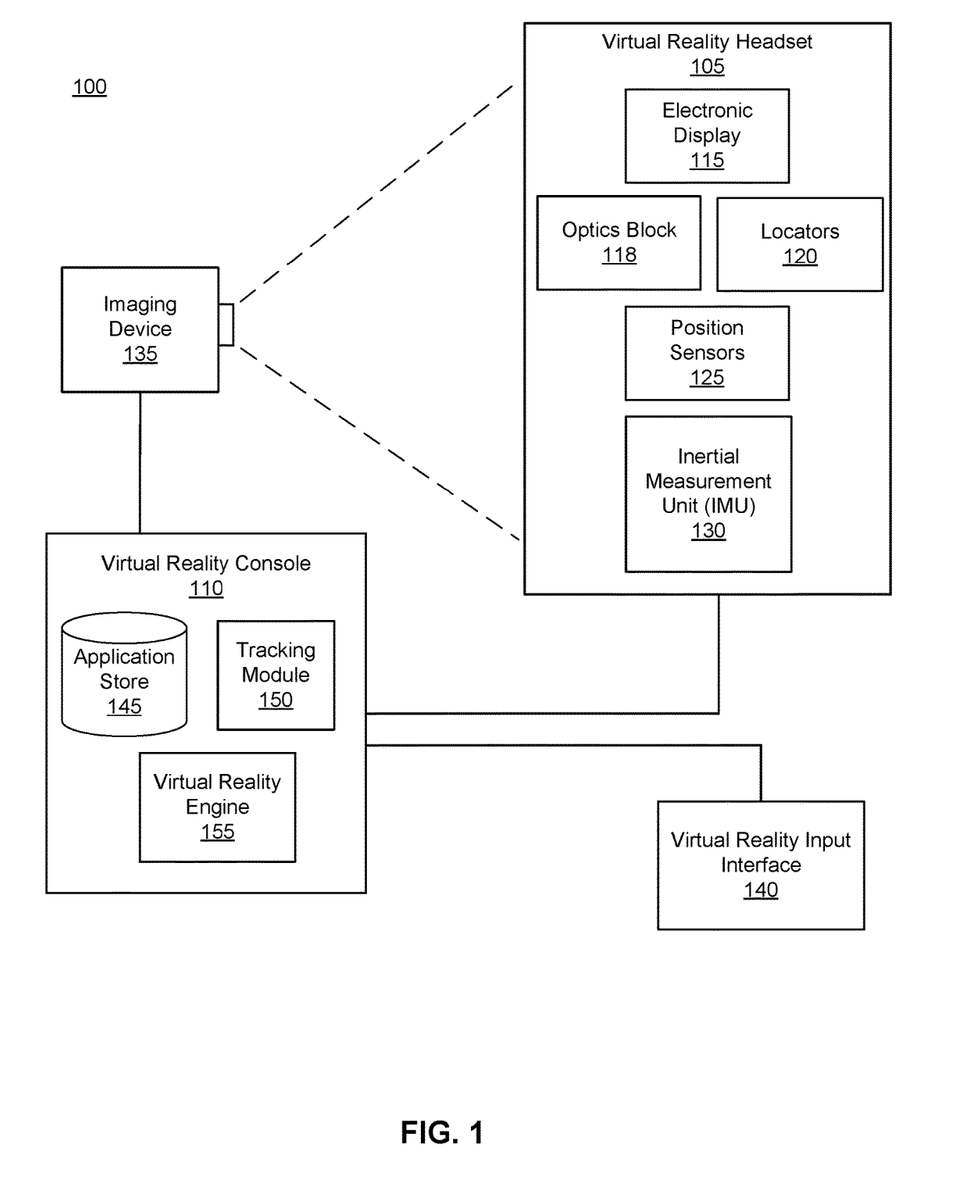
FIG. 1 is a block diagram of a system environment including a virtual reality system, in accordance with an embodiment.

FIG. 1 is a block diagram of a virtual reality (VR) system environment 100 in which a VR console 110 operates. The system environment 100 shown by FIG. 1 comprises a VR headset 105, an imaging device 135, and a VR input interface 140 that are each coupled to the VR console 110. While FIG. 1 shows an example system 100 including one VR headset 105, one imaging device 135, and one VR input interface 140, in other embodiments any number of these components may be included in the system 100. For example, there may be multiple VR headsets 105 each having an associated VR input interface 140 and being monitored by one or more imaging devices 135, with each VR headset 105, VR input interface 140, and imaging devices 135 communicating with the VR console 110. In alternative configurations, different and/or additional components may be included in the system environment 100.

The VR headset 105 is a head-mounted display that presents media to a user. Examples of media presented by the VR head set include one or more images, video, audio, or some combination thereof. In some embodiments, audio is presented via an external device (e.g., speakers and/or headphones) that receives audio information from the VR headset 105, the VR console 110, or both, and presents audio data based on the audio information. An embodiment of the VR headset 105 is further described below in conjunction with FIGS. 2A and 2B. The VR headset 105 may comprise one or more rigid bodies, which may be rigidly or non-rigidly coupled to each other together. A rigid coupling between rigid bodies causes the coupled rigid bodies to act as a single rigid entity. In contrast, a non-rigid coupling between rigid bodies allows the rigid bodies to move relative to each other. In some embodiments, the VR headset 105 may also act as an augmented reality (AR) headset and/or a mixed reality (MR) headset. In these embodiments, the VR headset 105 augments views of a physical, real-world environment with computer-generated elements (e.g., images, video, sound, etc.).

The VR headset 105 includes an electronic display 115, an optics block 118, one or more locators 120, one or more position sensors 125, and an inertial measurement unit (IMU) 130. The electronic display 115 displays images to the user in accordance with data received from the VR console 110. In various embodiments, the electronic display 115 may comprise a single electronic display or multiple electronic displays (e.g., a display for each eye of a user). Examples of the electronic display 115 include: a liquid crystal display (LCD), an organic light emitting diode (OLED) display, an active-matrix organic light-emitting diode display (AMOLED), some other display, or some combination thereof.

The electronic display 115 includes a display area comprising a plurality of sub-pixels (e.g., OLEDs, LEDs, transparent OLED (TOLED), etc.), where a sub-pixel is a discrete light emitting component that is positioned in the emission layer. For example, a sub-pixel emits red light, yellow light, blue light, green light, white light, or any other suitable color of light. A sub-pixel includes both an emission area, and a non-emission area, and a fill factor of the sub-pixel describes the ratio of light emission area versus total area of the sub-pixel. It is desirable to have a high fill factor as it reduces fixed pattern noise in a display area. The display area is what is viewed by the viewing user. The emission area is an area of the sub-pixel which emits light. The majority of light emitted from a sub-pixel is toward the display area of the electronic display 115. For example, a sub-pixel may be a top emitting OLED that is oriented to emit light toward the display area. However, each sub-pixel also emits a portion of light toward the substrate, this light is referred to as rear emitted light. The non-emission area is an area of the sub-pixel which does not emit light, and generally includes transistors, electrodes, etc., which belong to the structure of the electronic display 115 and are not active emitters of light. Different sub-pixels are separated from each other by the non-emission areas (also referred to as dark spaces) of adjacent sub-pixels. As discussed in detail below, the electronic display 115 includes a reflective layer that reflects rear emitted light, through the various layers in the electronic display 115, toward one or more non-emission areas that are adjacent to the sub-pixel. The reflective layer may be, for example, a metal film, a plurality of micro-reflectors (e.g., concave or diverging), or some combination thereof. For a given sub-pixel, by reflecting the rear emitted light, via the reflective layer, such that the reflected light is directed toward the non-emission areas (i.e., backfills the dark spaces), in effect, an effective area of emitted light relative to the total area of the sub-pixel is increased, and thereby the fill factor is increased.

In some embodiments, images projected by the electronic display 115 are rendered on the sub-pixel level. This is distinct from, say an RGB (red-green-blue) layout, which has discrete red, green, and blue pixels (red, green, and blue) and each pixel in the RGB layout includes a red sub-pixel, which is adjacent to a green sub-pixel that is adjacent to a blue sub-pixel; the red, green, and blue sub-pixels operate together to form different colors. In an RGB layout a sub-pixel in a pixel is restricted to working within that pixel. However, in some embodiments, sub-pixels in the electronic display operate within multiple "logical" pixels in their surrounding vicinity to form different colors. The sub-pixels are arranged on the display area of the electronic display 115 in a sub-pixel array. Examples of a sub-pixel array include PENTILE® RGBG, PENTILE® RGBW, some another suitable arrangement of sub-pixels that renders images at the sub-pixel level.

The optics block 118 magnifies received light from the electronic display 115, corrects optical errors associated with the image light, and the corrected image light is presented to a user of the VR headset 105. An optical element may be an aperture, a Fresnel lens, a convex lens, a concave lens, a filter, or any other suitable optical element that affects the image light emitted from the electronic display 115. Moreover, the optics block 118 may include combinations of different optical elements. In some embodiments, one or more of the optical elements in the optics block 118 may have one or more coatings, such as anti-reflective coatings.

Magnification of the image light by the optics block 118 allows the electronic display 115 to be physically smaller, weigh less, and consume less power than larger displays. Additionally, magnification may increase a field of view of the displayed media. For example, the field of view of the displayed media is such that the displayed media is presented using almost all (e.g., 110 degrees diagonal), and in some cases all, of the user's field of view. Magnification of the image light may cause an increase in fixed pattern noise, also referred to as the "screen door effect," which is a visual artifact where dark space separating pixels and/or sub-pixels of a display become visible to a user in an image presented by the display. However, as noted above, the reflective layer in the electronic display 115 is directing rear emitted light toward the dark spaces (non emission areas), thus reducing the screen door effect. In some embodiments, the dark spaces can effectively be reduced to zero. For example, reflective layer directs the rear emitted light such that the images of adjacent sub-pixels are distinguishable and increased in size to cover what would otherwise be a dark space between the adjacent sub-pixels. In some embodiments, the optics block 118 is designed so its effective focal length is larger than the spacing to the electronic display 115, which magnifies the image light projected by the electronic display 115. Additionally, in some embodiments, the amount of magnification may be adjusted by adding or removing optical elements.

The optics block 118 may be designed to correct one or more types of optical error. Examples of optical error include: two dimensional optical errors, three dimensional optical errors, or some combination thereof. Two dimensional errors are optical aberrations that occur in two dimensions. Example types of two dimensional errors include: barrel distortion, pincushion distortion, longitudinal chromatic aberration, transverse chromatic aberration, or any other type of two-dimensional optical error. Three dimensional errors are optical errors that occur in three dimensions. Example types of three dimensional errors include spherical aberration, comatic aberration, field curvature, astigmatism, or any other type of three-dimensional optical error. In some embodiments, content provided to the electronic display 115 for display is pre-distorted, and the optics block 118 corrects the distortion when it receives image light from the electronic display 115 generated based on the content.

The locators 120 are objects located in specific positions on the VR headset 105 relative to one another and relative to a specific reference point on the VR headset 105. A locator 120 may be a light emitting diode (LED), a corner cube reflector, a reflective marker, a type of light source that contrasts with an environment in which the VR headset 105 operates, or some combination thereof. In embodiments where the locators 120 are active (i.e., an LED or other type of light emitting device), the locators 120 may emit light in the visible band (~380 nm to 750 nm), in the infrared (IR)

band (~750 nm to 1 mm), in the ultraviolet band (10 nm to 380 nm), some other portion of the electromagnetic spectrum, or some combination thereof.

In some embodiments, the locators 120 are located beneath an outer surface of the VR headset 105, which is transparent to the wavelengths of light emitted or reflected by the locators 120 or is thin enough to not substantially attenuate the wavelengths of light emitted or reflected by the locators 120. Additionally, in some embodiments, the outer surface or other portions of the VR headset 105 are opaque in the visible band of wavelengths of light. Thus, the locators 120 may emit light in the IR band under an outer surface that is transparent in the IR band but opaque in the visible band.

The IMU 130 is an electronic device that generates fast calibration data based on measurement signals received from one or more of the position sensors 125. A position sensor 125 generates one or more measurement signals in response to motion of the VR headset 105. Examples of position sensors 125 include: one or more accelerometers, one or more gyroscopes, one or more magnetometers, another suitable type of sensor that detects motion, a type of sensor used for error correction of the IMU 130, or some combination thereof. The position sensors 125 may be located external to the IMU 130, internal to the IMU 130, or some combination thereof.

Based on the one or more measurement signals from one or more position sensors 125, the IMU 130 generates fast calibration data indicating an estimated position of the VR headset 105 relative to an initial position of the VR headset 105. For example, the position sensors 125 include multiple accelerometers to measure translational motion (forward/back, up/down, left/right) and multiple gyroscopes to measure rotational motion (e.g., pitch, yaw, roll). In some embodiments, the IMU 130 rapidly samples the measurement signals and calculates the estimated position of the VR headset 105 from the sampled data. For example, the IMU 130 integrates the measurement signals received from the accelerometers over time to estimate a velocity vector and integrates the velocity vector over time to determine an estimated position of a reference point on the VR headset 105. Alternatively, the IMU 130 provides the sampled measurement signals to the VR console 110, which determines the fast calibration data. The reference point is a point that may be used to describe the position of the VR headset 105. While the reference point may generally be defined as a point in space; however, in practice the reference point is defined as a point within the VR headset 105 (e.g., a center of the IMU 130).

The IMU 130 receives one or more calibration parameters from the VR console 110. As further discussed below, the one or more calibration parameters are used to maintain tracking of the VR headset 105. Based on a received calibration parameter, the IMU 130 may adjust one or more IMU parameters (e.g., sample rate). In some embodiments, certain calibration parameters cause the IMU 130 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

The imaging device 135 generates slow calibration data in accordance with calibration parameters received from the VR console 110. Slow calibration data includes one or more images showing observed positions of the locators 120 that are detectable by the imaging device 135. The imaging device 135 may include one or more cameras, one or more video cameras, any other device capable of capturing images including one or more of the locators 120, or some combination thereof. Additionally, the imaging device 135 may include one or more filters (e.g., used to increase signal to noise ratio). The imaging device 135 is configured to detect light emitted or reflected from locators 120 in a field of view of the imaging device 135. In embodiments where the locators 120 include passive elements (e.g., a retroreflector), the imaging device 135 may include a light source that illuminates some or all of the locators 120, which retroreflect the light towards the light source in the imaging device 135. Slow calibration data is communicated from the imaging device 135 to the VR console 110, and the imaging device 135 receives one or more calibration parameters from the VR console 110 to adjust one or more imaging parameters (e.g., focal length, focus, frame rate, ISO, sensor temperature, shutter speed, aperture, etc.).

The VR input interface 140 is a device that allows a user to send action requests to the VR console 110. An action request is a request to perform a particular action. For example, an action request may be to start or end an application or to perform a particular action within the application. The VR input interface 140 may include one or more input devices. Example input devices include: a keyboard, a mouse, a game controller, or any other suitable device for receiving action requests and communicating the received action requests to the VR console 110. An action request received by the VR input interface 140 is communicated to the VR console 110, which performs an action corresponding to the action request. In some embodiments, the VR input interface 140 may provide haptic feedback to the user in accordance with instructions received from the VR console 110. For example, haptic feedback is provided when an action request is received, or the VR console 110 communicates instructions to the VR input interface 140 causing the VR input interface 140 to generate haptic feedback when the VR console 110 performs an action.

The VR console 110 provides media to the VR headset 105 for presentation to the user in accordance with information received from one or more of: the imaging device 135, the VR headset 105, and the VR input interface 140. In the example shown in FIG. 1, the VR console 110 includes an application store 145, a tracking module 150, and a virtual reality (VR) engine 155. Some embodiments of the VR console 110 have different modules than those described in conjunction with FIG. 1. Similarly, the functions further described below may be distributed among components of the VR console 110 in a different manner than is described here.

The application store 145 stores one or more applications for execution by the VR console 110. An application is a group of instructions, that when executed by a processor, generates content for presentation to the user. Content generated by an application may be in response to inputs received from the user via movement of the HR headset 105 or the VR interface device 140. Examples of applications include: gaming applications, conferencing applications, video playback application, or other suitable applications.

The tracking module 150 calibrates the VR system 100 using one or more calibration parameters and may adjust one or more calibration parameters to reduce error in determination of the position of the VR headset 105. For example, the tracking module 150 adjusts the focus of the imaging device 135 to obtain a more accurate position for observed locators on the VR headset 105. Moreover, calibration performed by the tracking module 150 also accounts for information received from the IMU 130. Additionally, if tracking of the VR headset 105 is lost (e.g., the imaging device 135 loses line of sight of at least a threshold number of the locators 120), the tracking module 140 re-calibrates some or all of the system environment 100.

The tracking module 150 tracks movements of the VR headset 105 using slow calibration information from the imaging device 135. The tracking module 150 determines positions of a reference point of the VR headset 105 using observed locators from the slow calibration information and a model of the VR headset 105. The tracking module 150 also determines positions of a reference point of the VR headset 105 using position information from the fast calibration information. Additionally, in some embodiments, the tracking module 150 may use portions of the fast calibration information, the slow calibration information, or some combination thereof, to predict a future location of the headset 105. The tracking module 150 provides the estimated or predicted future position of the VR headset 105 to the VR engine 155.

The VR engine 155 executes applications within the system environment 100 and receives position information, acceleration information, velocity information, predicted future positions, or some combination thereof of the VR headset 105 from the tracking module 150. Based on the received information, the VR engine 155 determines content to provide to the VR headset 105 for presentation to the user. For example, if the received information indicates that the user has looked to the left, the VR engine 155 generates content for the VR headset 105 that mirrors the user's movement in a virtual environment. Additionally, the VR engine 155 performs an action within an application executing on the VR console 110 in response to an action request received from the VR input interface 140 and provides feedback to the user that the action was performed. The provided feedback may be visual or audible feedback via the VR headset 105 or haptic feedback via the VR input interface 140.

Figure 2A:
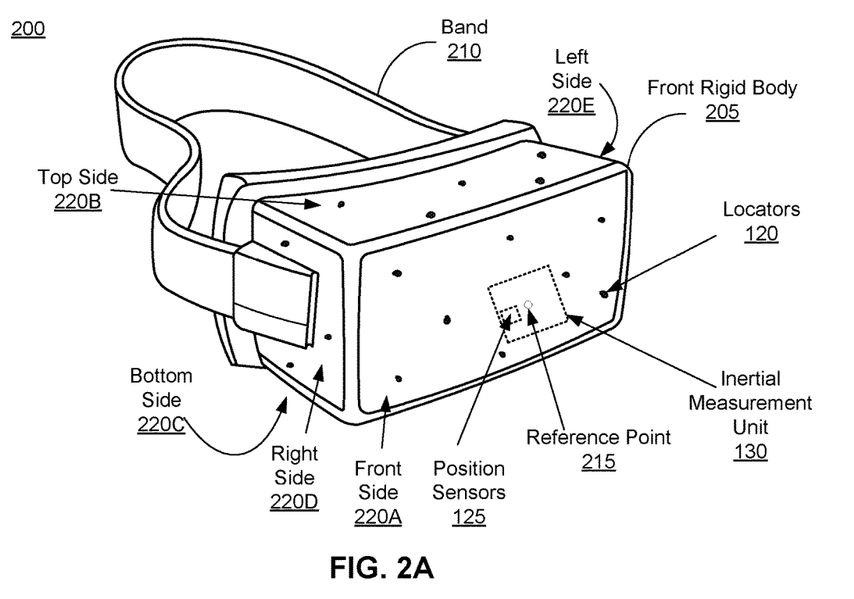
FIG. 2A is a diagram of a virtual reality headset, in accordance with an embodiment.

FIG. 2A is a diagram of a virtual reality (VR) headset, in accordance with an embodiment. The VR headset 200 is an embodiment of the VR headset 105, and includes a front rigid body 205 and a band 210. The front rigid body 205 includes one or more electronic display elements of the electronic display 115 (not shown in FIG. 2A), the IMU 130, the one or more position sensors 125, and the locators 120. In the embodiment shown by FIG. 2A, the position sensors 125 are located within the IMU 130, and neither the IMU 130 nor the position sensors 125 are visible to the user.

The locators 120 are located in fixed positions on the front rigid body 205 relative to one another and relative to a reference point 215. In the example of FIG. 2A, the reference point 215 is located at the center of the IMU 130. Each of the locators 120 emit light that is detectable by the imaging device 135. Locators 120, or portions of locators 120, are located on a front side 220A, a top side 220B, a bottom side 220C, a right side 220D, and a left side 220E of the front rigid body 205 in the example of FIG. 2A.

Figure 2B:
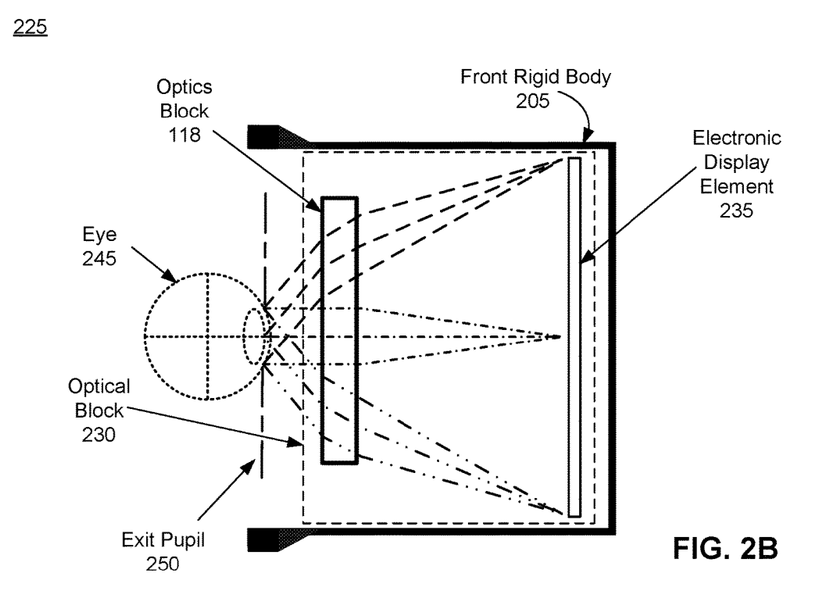
FIG. 2B is a cross section of a front rigid body of the VR headset in FIG. 2A, in accordance with an embodiment.

FIG. 2B is a cross section 225 of the front rigid body 205 of the embodiment of a VR headset 200 shown in FIG. 2A. As shown in FIG. 2B, the front rigid body 205 includes an optical block 230 that provides altered image light to an exit pupil 250. The exit pupil 250 is the location of the front rigid body 205 where a user's eye 245 is positioned. For purposes of illustration, FIG. 2B shows a cross section 225 associated with a single eye 245, but another optical block, separate from the optical block 230, provides altered image light to another eye of the user.

The optical block 230 includes an electronic display element 235 of the electronic display 115, and the optics block 118. The electronic display element 235 emits image light toward the optics block 118. The optics block 118 magnifies the image light, and in some embodiments, also corrects for one or more additional optical errors (e.g., distortion, astigmatism, etc.). The optics block 118 directs the image light to the exit pupil 250 for presentation to the user.

Figure 3A:
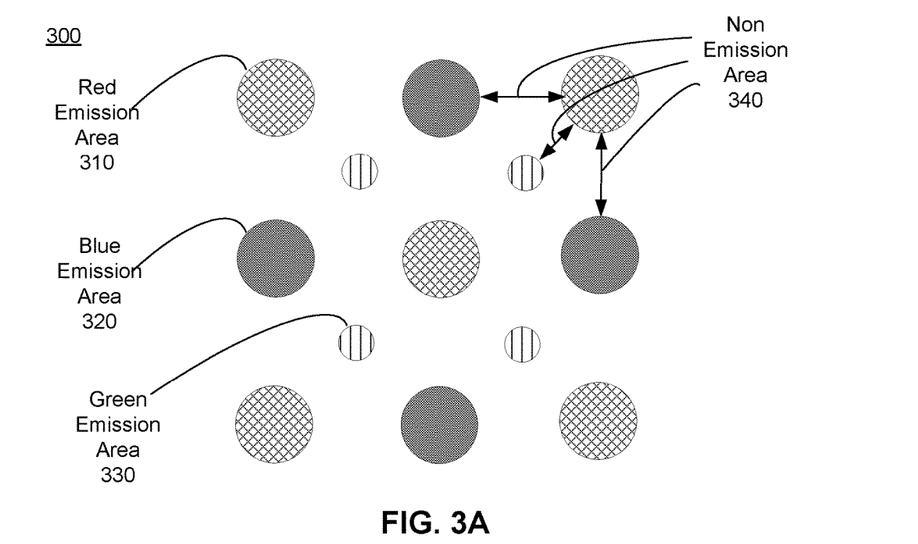
FIG. 3A is an example array of sub-pixel emission areas on an electronic display element including a reflective layer, in accordance with an embodiment.

FIG. 3A is an example array 300 of sub-pixel emission areas on an electronic display element (e.g., electronic display element 235) including a reflective layer. In some embodiments, the array 300 may be on a display element of some other electronic display, e.g., a computer monitor, a television set, etc. The example array 300 shown in FIG. 3A includes emission areas 310, 320, and 330 for respectively, red sub-pixels, blue sub-pixels, and green sub-pixels. The emission areas 310, 320, 330 correspond to areas of the sub-pixels that actively emit light (referred to as primary emission light) toward a viewing user. A non-emission area 340 separates the emission areas of each sub-pixel from one or more adjacent emission areas of other sub-pixels. The non-emission area 340 is a portion of the array 300 that does not emit light, and in conventional electronic displays may become visible to a user under certain circumstances (e.g., magnification) causing the screen door effect that degrades image quality. As discussed in detail below with regard to FIGS. 3B, 4A, 4B, and 4C, the electronic display includes a reflective layer that, for a given sub-pixel, reflects rear emitted light into the non-emission areas 340 adjacent to the sub-pixels emission area, thereby increasing the emission area to a larger effective emission area. An effective emission area is an emission area of a sub-pixel that has been increased by reflecting rear emitted light from that sub-pixel into non-emission areas adjacent to the sub-pixel.

Figure 3B:
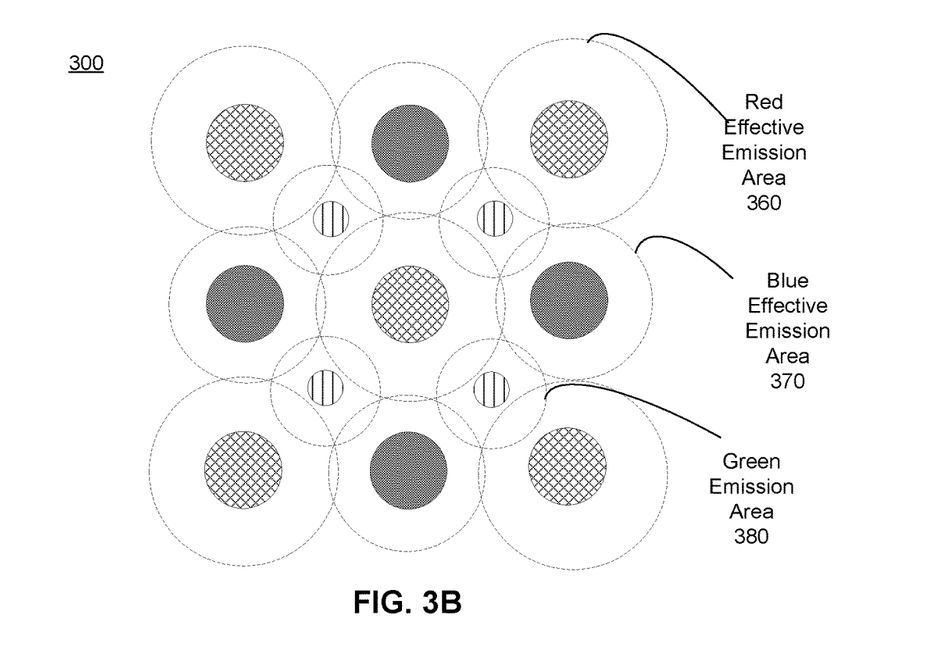
FIG. 3B is an example of image light emitted by the array of sub-pixels in FIG. 3A, in accordance with an embodiment.

FIG. 3B is an example of image light emitted by the array of sub-pixels 300 in FIG. 3A, according to an embodiment. As shown in FIG. 3B, each of the sub-pixels has an associated effective emission area. Specifically, the red sub-pixels have a corresponding effective emission area 360, the blue sub-pixels have a corresponding effective emission area 370, and the green sub-pixels have a corresponding effective emission area 380. So long as an effective emission area does not overlap with a point of maximum intensity of an adjacent effective emission area, the two effective emission areas are resolvable as two adjacent sub-pixels. The shape of the effective emission area is not necessarily a circle, but is rather an area including the emission area of a sub-pixel. It is apparent from FIG. 3B that the fill factor of a sub-pixel in an electronic display including a reflective layer is higher than, for example, a sub-pixel in an electronic display that does not include a reflective layer.

Figure 4A:
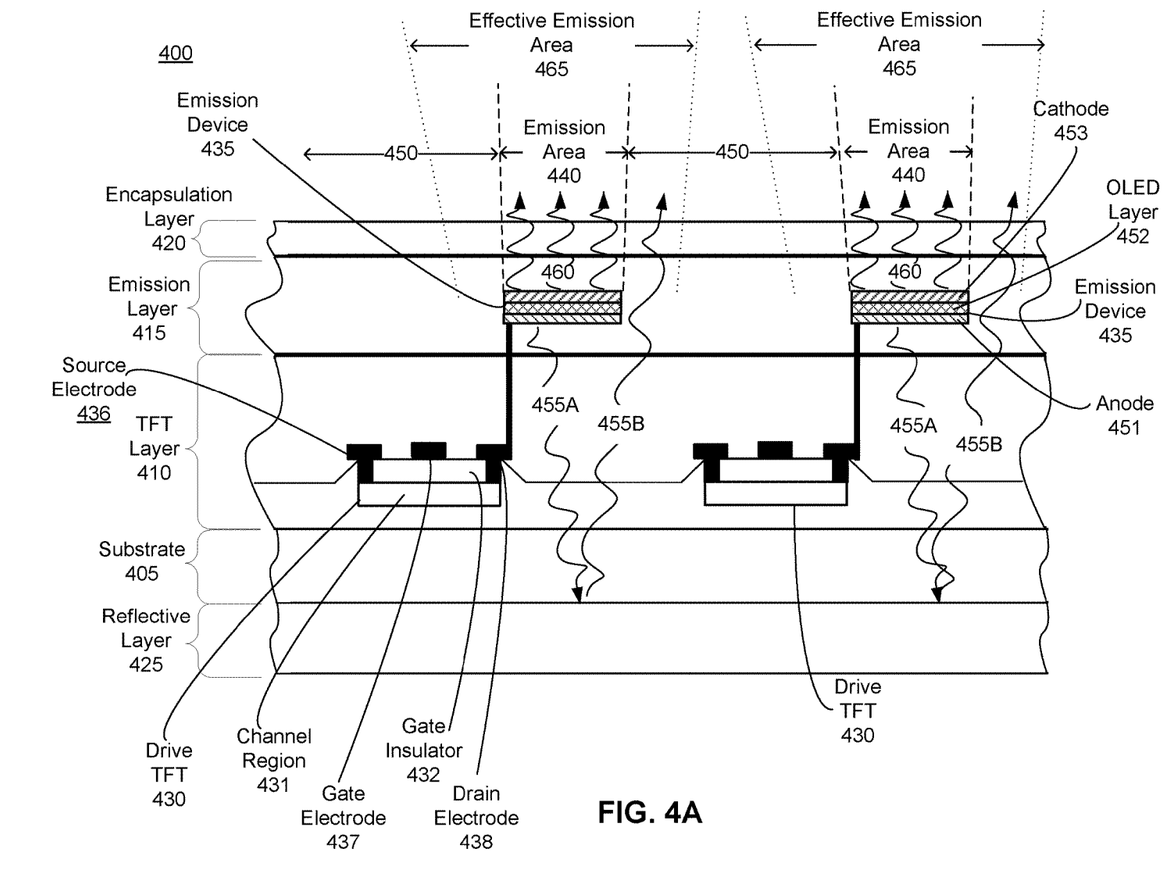
FIG. 4A is a cross section of an electronic display including a reflective layer, in accordance with an embodiment.

FIG. 4A is a cross section 400 of an electronic display including a reflective layer 425, in accordance with an embodiment. In some embodiments, the electronic display is the electronic display 115 of the VR headset 105. In other embodiments it is some other electronic display, e.g., a computer monitor, a television set, etc.

The electronic display is composed of different layers. The electronic display includes a substrate 405, a thin-film-transistor (TFT) layer 410, an emission layer 415, an encapsulation layer 420, and a reflective layer 425. Some embodiments of the electronic display have different layers than those described here. Similarly, the functions of the substrate 405, the thin-film-transistor (TFT) layer 410, the emission layer 415, and the encapsulation layer 420 may be distributed among the layers in a different manner than is described herein.

The substrate 405 is a substance that serves as a foundation for adding the layers of the electronic display 400. The substrate 405 may be e.g., silicon, silicon dioxide, sapphire, plastic, or some other semiconductor that is at least partially transmissive to light emitted by the sub-pixels. The substrate 405 has a top surface and a bottom surface.

The TFT layer 410 includes a top surface and a bottom surface, and is formed on the top surface of the substrate 405. The TFT layer 410 includes a plurality of driving TFTs 430 that are configured to provide current to one or emission devices 435 in the emission layer 415. Each driving TFT 430 includes a channel region 431, gate insulator 432, a source electrode 436, a gate electrode 437, and a drain electrode 438. For simplicity other TFTs that typically reside in the TFT layer 410 are omitted from FIG. 4A. In one embodiment, the active areas (e.g., channel areas) of the TFT may be fabricated using LTPS (Low Temperature Polysilicon). In some embodiments, some or all of the TFTs are composed of materials that are at least partially transparent to light emitted by the emission devices 435. For example, Indium Tin Oxide or some other transparent conductive material may be used instead of opaque metals as the material for the source electrodes 436, gate electrodes 437, and drain electrodes 438 of the TFTs.

The emission layer 415 includes a plurality of emission devices 435. An emission device 435 is a device that emits light. The emission layer 415 includes a top surface and a bottom surface, and is deposited on the top surface of the TFT layer 410. An emission device 435 may be current driven devices, e.g., OLEDs, LEDs, a transparent OLED (TOLED), some other device that emits light, or some combination thereof. In the example of FIG. 4A, each of the emission devices 435 is an OLED that has an anode 451, cathode 453, and an organic light emitting layer 452 formed between the anode 451 and cathode 453. Each emission device 435 corresponds to an emission area 440 of a single sub-pixel, and has a color type. The color type of an emission device 435 determines what range of light wavelengths is emitted from the emission device 435. Color type may be, for example, red light, yellow light, blue light, green light, white light, or any other suitable color of light. The emission layer 415 may include emission devices 435 of the same color type and/or different color types. Additionally, the emission devices 435 are arranged in the emission layer 415 in a particular spatial configuration like, for example, PENTILE® RGBG, PENTILE® RGBW, RGB, or some another suitable arrangement emission devices 435.

The emission devices 435 (OLEDs in the example of FIG. 4A) are configured to be top emitting, such that a majority of the light emitted from the emission devices 435, referred to as the primary emission light 460, is directed toward their respective emission areas 440. However, each emission device 435 also generates rear emitted light 455A, which is light emitted toward the substrate 405.

The encapsulation layer 420 is formed on a top surface of the emission layer 420 and protects the emission layer 415 from environmental factors (e.g., oxygen, water, etc.). The encapsulation layer 420 is transparent to the light emitted from the emission device 435, and may be formed from, e.g., transparent glass, sapphire, plastic, some other material that is transparent to the light emitted by emission devices 435, or some combination thereof.

The reflective layer 425 reflects rear emitted light 455A, through every layer in the electronic display, toward one or more non-emission areas 450. In one embodiment, the reflective layer 425 is a metal film (e.g., silver, aluminum, gold, etc.) that is reflective to the rear emitted light 455A, such that at least some of the rear emitted light 455A is reflected 455B toward the non-emission areas 450. The non-emission areas 450 are areas of a sub-pixels which do not receive primary emission light 460, and may receive reflected rear emitted light 455B. For a given emission device 435, the reflection of the rear emitted light 455A toward non-emission areas 450 surrounding the emission device 435 increases the emission area 440 to a larger effective emission area 465. As the effective emission area 465 is larger than the emission area 440, accordingly, the fill factor of the emission device 435 is also larger than that of a sub-pixel in a conventional display that does not include a reflective layer 425. Additionally, the increase in fill factor may reduce, and possibly eliminate, fixed pattern noise as there may be little or no dark space between adjacent emission devices 435. Other embodiments of the reflective layer 425 are discussed below with regard to FIGS. 4B and 4C.

The reflective layer 425 is formed onto the bottom surface of the substrate 405. For example, the reflective layer 425 may be laminated, glued, applied using deposition techniques, etc., to the bottom surface of the substrate 405.

Note, some of the reflected light 455B may intersect with portions of the drive TFTs 430, the emission devices 435, some other obstruction, etc., that may attenuate the reflected light 455B. In some embodiments, some or all of the obstructions may be composed of transparent or partially transparent materials. For example, an anode and/or cathode of an emission device 435 may be composed of indium tin oxide (ITO), or some other substantially transparent conducive material.

Figure 4B:
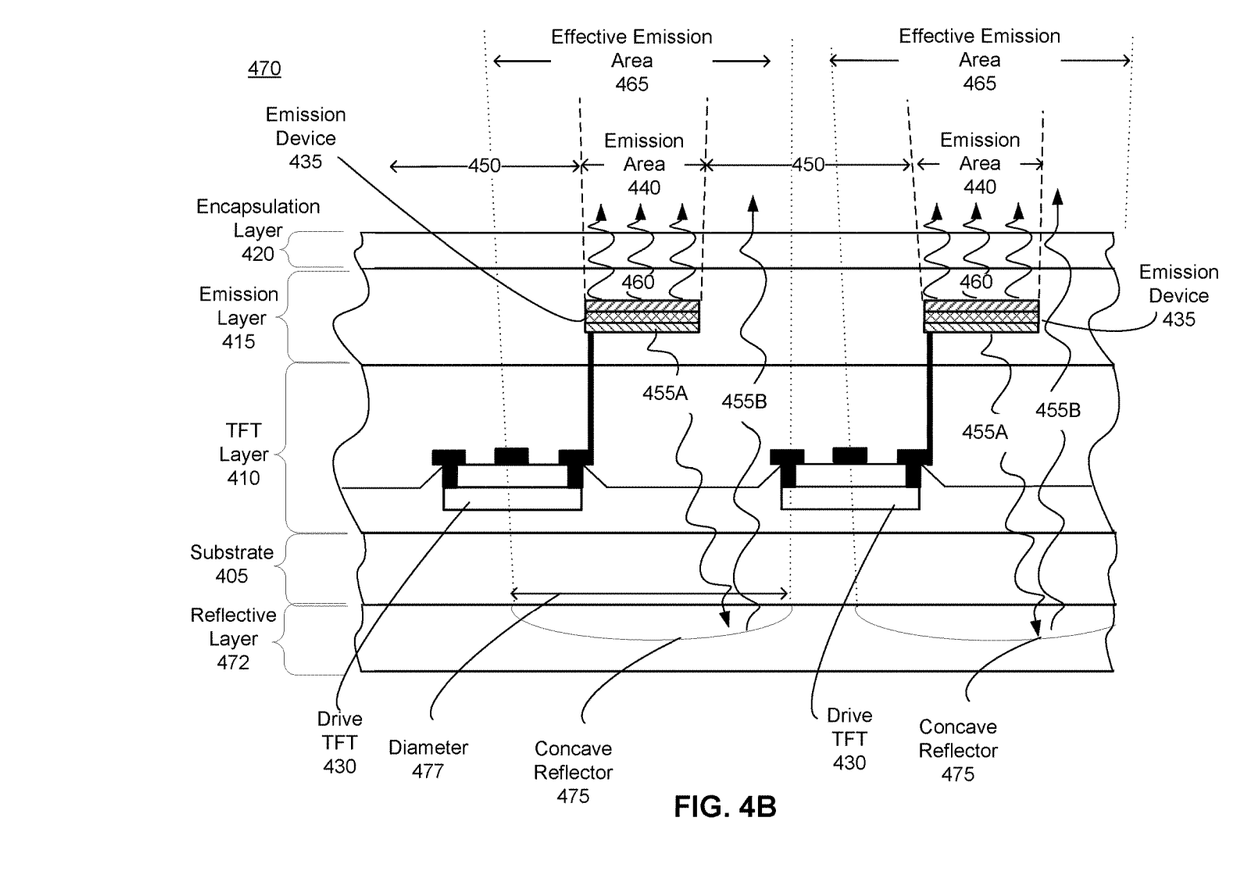
FIG. 4B is a cross section of an electronic display including a reflective layer that includes a plurality of concave reflectors, in accordance with an embodiment.

FIG. 4B is a cross section 470 of an electronic display including a reflective layer 472 that includes a plurality of concave reflectors 475, in accordance with an alternative embodiment. The electronic display is substantially similar to the electronic display described in FIG. 4A, except that that it has a different reflective layer 472. The reflective layer 472 includes a plurality of concave reflectors 475. A concave reflector 475 may have, e.g., a parabolic surface profile, a spherical surface profile, a freeform surface profile, or some other surface profile that is configured to direct at least a portion of the reflected light 455B to one or more toward non-emission areas 450. Each concave reflector 475 may be positioned directly underneath a corresponding emission device 435, and the focus of each concave reflector 475 being located within a threshold distance to the emission point of the rear emitted light 455A. The threshold distance is selected such that the focus of each concave reflector 475 is at or near the emission point of the rear emitted light 455A. For a given concave reflector 475, as the emission point is located at/near the focal point of the concave reflector 475, the concave reflector 475 will substantially collimate the reflected light 465B over an entire diameter 477 of the concave reflector 475. In some embodiments, each of the concave reflectors 475 are parallel to each of the emission devices 435 such that the reflected rear emitted light 455B is substantially parallel to the primary emission light 460. In some embodiments, the concave reflectors 475 are sized such that there is some overlap in the effective emission areas 465 of adjacent emission devices 435, so long as the points of maximum intensity for each of the emission devices 435 do not overlap. This eliminates dark space between emission devices 435 while keeping the two effective emission areas 465 as separate resolvable sub-pixels.

Figure 4C:
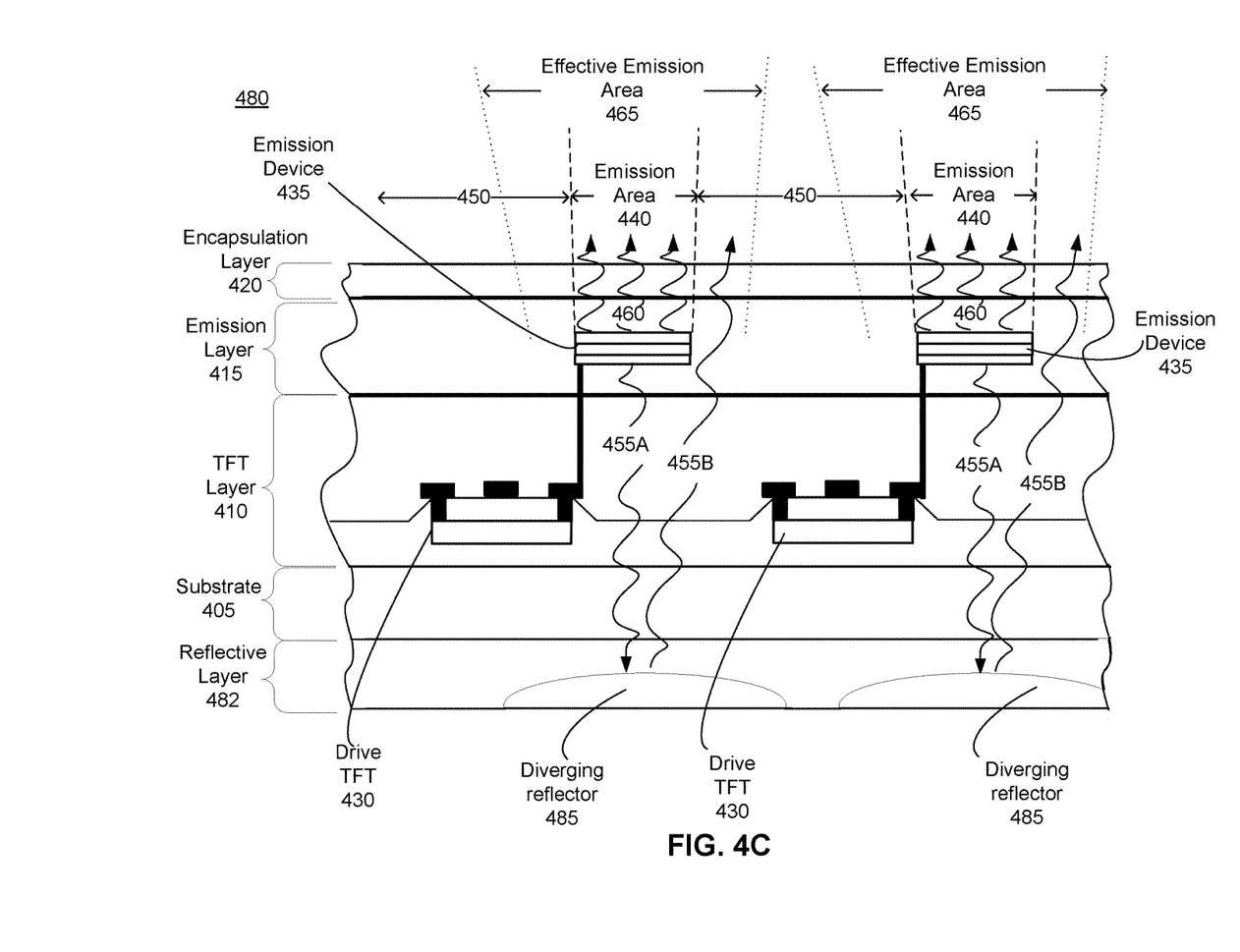
FIG. 4C is a cross section of an electronic display including a reflective layer that includes a plurality of diverging reflectors, in accordance with an embodiment.

FIG. 4C is a cross section 480 of an electronic display including a reflective layer 482 that includes a plurality of diverging reflectors 485, in accordance with an embodiment. The electronic display is substantially similar to the electronic display described in FIG. 4A except that that it has a different reflective layer 482. The reflective layer 482 includes a plurality of diverging reflectors 485. Each diverging reflector 485 may be positioned directly underneath a corresponding emission device 435 and/or offset from the corresponding emission device 435. The diverging reflectors 485 are shaped to reflect light 455B toward non-emission areas 450, and thereby increase the emission areas 440 to effective emission areas 465.

In alternate embodiments, the electronic display includes a reflective layer that includes micro-reflectors and/or reflective structures other than the concave reflectors 475 and diverging reflectors 485. For example, a reflective layer may include a sawtooth structure that reflects the rear emitted light 455A toward the toward non-emission areas 450.

In some cases, the micro-reflectors may be polygons (e.g., a pentagon, hexagon, etc.). Additionally, in some cases, the electronic display includes a hybrid reflective layer. A hybrid reflective layer is a reflective layer that includes at least two different types of structures that reflect the rear emitted light 455A toward non-emission areas 450. A type of reflecting structure may be, for example, a metal film, a concave reflector 475, a diverging reflector 485, a sawtooth structure, or some other structure that reflects the rear emitted light 455A towards non-emission areas 450. A hybrid reflective layer may include, e.g., a reflective layer 425, one or more concave reflectors 475, one or more diverging reflectors 485, a sawtooth structure, some other structure that reflects the rear emitted light 455A towards non-emission areas 450, or some combination thereof.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An electronic display comprising:
   a substrate;
   a TFT (thin-film transistor) layer deposited on a top surface of the substrate, the TFT layer including a plurality of driving TFTs that are configured to provide current to one or more OLEDs (organic light emitting diodes);
   an emission layer deposited on a top surface of the TFT layer and including emission areas and non-emission areas separating the emission areas, the emission areas including a plurality of OLEDs each of which is configured to be driven by one or more of the driving TFTs to emit light, and the non-emission areas corresponding to areas of the emission layer not including the plurality of OLEDs and at least partially overlapping with at least a portion of the driving TFTs of the TFT layer; and
   a reflective layer formed on a bottom surface of the substrate and configured to reflect at least some of the light emitted from the OLEDs toward the non-emission areas of the emission layer.

2. The electronic display of claim 1, wherein the reflective layer includes a plurality of reflectors positioned to reflect the at least some of the light emitted from the OLEDs toward the non-emission areas.

3. The electronic display of claim 2, wherein the reflective layer includes a top surface and the plurality of reflectors are concave reflectors that are formed on the top surface of the reflective layer, and portions of the top surface of the reflective layer are in contact with the bottom surface of the substrate.

4. The electronic display of claim 3, wherein each of the emission areas is generated by a corresponding OLED, and each of the concave reflectors is positioned below the corresponding OLED.

5. The electronic display of claim 3, wherein the OLEDs are positioned within a threshold distance of focus locations of the concave reflectors, such that light reflected by the concave reflectors is collimated.

6. The electronic display of claim 2, wherein the reflective layer includes a bottom surface and a top surface that is in contact with the bottom surface of the substrate, and the plurality of reflectors are diverging reflectors that are formed on the bottom surface of the reflective layer.

7. The electronic display of claim 6, wherein each of the emission areas is generated by a corresponding OLED, and each of the diverging reflectors is positioned at an offset distance from the corresponding OLED.

8. The electronic display of claim 7, wherein each of the diverging reflectors is positioned directly under the corresponding OLED.

9. The electronic display of claim 1, wherein the reflective layer includes a sawtooth structure configured to reflect the at least some of the light emitted from the OLEDs toward the non-emission areas.

10. The electronic display of claim 1, wherein the reflective layer is a hybrid reflective layer that includes at least two types of reflecting structures, and a type of reflecting structure is selected from a group consisting of: a metal film, a concave reflectors, a diverging reflector, and a sawtooth structure.

11. An electronic display comprising:
a substrate;
a TFT (thin-film transistor) layer deposited on a top surface of the substrate, the TFT layer including a plurality of driving TFTs that are configured to provide current to one or more OLEDs (organic light emitting diodes);
an emission layer deposited on a top surface of the TFT layer and including emission areas and non-emission areas separating the emission areas, the emission areas including a plurality of OLEDs each of which is configured to be driven by one or more of the driving TFTs to emit light, and the non-emission areas corresponding to areas of the emission layer not including the plurality of OLEDs and at least partially overlapping with at least a portion of the driving TFTs of the TFT layer;
an encapsulation layer that is formed on a top surface of the emission layer; and
a reflective layer formed on a bottom surface of the substrate and configured to reflect at least some of the light emitted from the OLEDs toward the non-emission areas of the emission layer.

12. The electronic display of claim 11, wherein the reflective layer includes a plurality of reflectors positioned to reflect the at least some of the light emitted from the OLEDs toward the non-emission areas.

13. The electronic display of claim 12, wherein the reflective layer includes a top surface and the plurality of reflectors are concave reflectors that are formed on the top surface of the reflective layer, and portions of the top surface of the reflective layer are in contact with the bottom surface of the substrate.

14. The electronic display of claim 13, wherein each of the emission areas is generated by a corresponding OLED, and each of the concave reflectors is positioned below the corresponding OLED.

15. The electronic display of claim 13, wherein the OLEDs are positioned within a threshold distance of focus locations of the concave reflectors, such that light reflected by the concave reflectors is collimated.

16. The electronic display of claim 12, wherein the reflective layer includes a bottom surface and a top surface that is in contact with the bottom surface of the substrate, and the plurality of reflectors are diverging reflectors that are formed on the bottom surface of the reflective layer.

17. The electronic display of claim 16, wherein each of the emission areas is generated by a corresponding OLED, and each of the diverging reflectors is positioned at an offset distance from the corresponding OLED.

18. The electronic display of claim 17, wherein each of the diverging reflectors is positioned directly under the corresponding OLED.

19. The electronic display of claim 11, wherein the reflective layer includes a sawtooth structure configured to reflect the at least some of the light emitted from the OLEDs toward the non-emission areas.

20. An electronic display comprising:
a substrate;
a TFT (thin-film transistor) layer deposited on a top surface of the substrate, the TFT layer including a plurality of driving TFTs that are configured to provide current to one or more OLEDs (organic light emitting diodes), the plurality of driving TFTs at least being partially transparent to a first band of light;
an emission layer deposited on a top surface of the TFT layer and including emission areas and non-emission areas separating the emission areas, the emission areas including a plurality of OLEDs each of which is configured to be driven by one or more of the driving TFTs to emit light in the first band, and the non-emission areas corresponding to areas of the emission layer not including the plurality of OLEDs and at least partially overlapping with at least a portion of the driving TFTs of the TFT layer; and
a reflective layer formed on a bottom surface of the substrate and configured to reflect at least some of the light emitted from the OLEDs toward the non-emission areas of the emission layer.

* * * * *

UNITED STATES PATENT AND TRADEMARK OFFICE
CERTIFICATE OF CORRECTION

PATENT NO. : 9,859,527 B2  
APPLICATION NO. : 15/062844  
DATED : January 2, 2018  
INVENTOR(S) : Shizhe Shen et al.

Page 1 of 1

It is certified that error appears in the above-identified patent and that said Letters Patent is hereby corrected as shown below:

Column 13, Line 25, after "concave" delete "reflectors" and insert -- reflector --.

Signed and Sealed this  
Twenty-sixth Day of June, 2018

Andrei Iancu  
*Director of the United States Patent and Trademark Office*